(12) United States Patent
Chen

(10) Patent No.: US 11,144,745 B2
(45) Date of Patent: Oct. 12, 2021

(54) OPTICAL FINGERPRINT SENSING MODULE AND ELECTRONIC DEVICE

(71) Applicant: Egis Technology Inc., Taipei (TW)

(72) Inventor: Pin-Yu Chen, Taipei (TW)

(73) Assignee: EGIS TECHNOLOGY INC., Taipei (TW)

( * ) Notice: Subject to any disclaimer, the term of this patent is extended or adjusted under 35 U.S.C. 154(b) by 340 days.

(21) Appl. No.: 16/383,620

(22) Filed: Apr. 14, 2019

(65) Prior Publication Data

US 2020/0026901 A1 Jan. 23, 2020

Related U.S. Application Data

(60) Provisional application No. 62/701,941, filed on Jul. 23, 2018.

(30) Foreign Application Priority Data

Jan. 24, 2019 (CN) .......................... 201910067561.6

(51) Int. Cl.
*G06K 9/00* (2006.01)
*G06F 3/042* (2006.01)
*H05K 1/18* (2006.01)

(52) U.S. Cl.
CPC ....... *G06K 9/00046* (2013.01); *G06F 3/0421* (2013.01); *H05K 1/189* (2013.01); *H05K 2201/10121* (2013.01)

(58) Field of Classification Search
CPC ............. G06K 9/00006; G06K 9/0004; G06K 9/00046; G06F 3/0421
See application file for complete search history.

(56) References Cited

U.S. PATENT DOCUMENTS

| 8,531,594 B2 | 9/2013 | Kim et al. | |
|---|---|---|---|
| 2018/0081480 A1 | 3/2018 | Ran et al. | |
| 2018/0365472 A1* | 12/2018 | Cai | ...................... G06K 9/0004 |
| 2021/0004558 A1* | 1/2021 | Zeng | .................. G06K 9/00013 |

FOREIGN PATENT DOCUMENTS

| CN | 107169452 A | * | 9/2017 | ......... G06K 9/00973 |
|---|---|---|---|---|
| CN | 207541546 U | | 6/2018 | |
| CN | 108323207 A | | 7/2018 | |
| CN | 207802047 | | 8/2018 | |
| CN | 208027381 U | | 10/2018 | |
| CN | 208027382 U | | 10/2018 | |
| CN | 108885696 A | | 11/2018 | |
| CN | 208044632 U | | 11/2018 | |
| CN | 108990336 A | | 12/2018 | |
| CN | 109074491 A | | 12/2018 | |
| CN | 109151270 A | | 1/2019 | |
| TW | I242751 | | 11/2005 | |
| TW | I552092 | | 10/2016 | |
| WO | WO2018133664 A1 | | 7/2018 | |

* cited by examiner

*Primary Examiner* — Kara E. Geisel
*Assistant Examiner* — Amanda Merlino

(57) ABSTRACT

An optical fingerprint sensing module attached to a base is provided. The base includes a first surface, a second surface and an opening extending through the first surface and the second surface. The optical fingerprint sensing module includes a fixing frame and a sensor integrated circuit (IC). The fixing frame is disposed in the opening of the base. The sensor IC is disposed in a receiving groove of the fixing frame and includes a plurality of photo sensors. The photo sensors receive light reflected from a user's finger through the opening of the base.

17 Claims, 10 Drawing Sheets

OPTICAL FINGERPRINT SENSING MODULE AND ELECTRONIC DEVICE

CROSS REFERENCE TO RELATED APPLICATIONS

This application claims the benefit of U.S. Provisional Application No. 62/701,941, filed on Jul. 23, 2018, and claims priority of China Patent Application No. 201910067561.6, filed on Jan. 24, 2019, the entirety of which are incorporated by reference herein.

BACKGROUND OF THE INVENTION

Field of the Invention

The invention relates to an optical fingerprint sensing module, and more particularly to an optical fingerprint sensing module disposed in a base of an electronic device.

Description of the Related Art

In recent years, biological identification technology has become increasingly mature, and different biological features can be used for identifying individual users. Since the recognition rate and accuracy of fingerprint identification technology are better than those of other biological feature identification technologies, fingerprint identification and verification are used extensively in various areas.

Fingerprint identification and verification technology detects a user's fingerprint pattern, captures fingerprint data from the fingerprint pattern, and saves the fingerprint data to the memory as a template, or directly saves the fingerprint pattern. Thereafter, the user presses or swipes a finger on or over the fingerprint sensor so that a fingerprint pattern is sensed and fingerprint data is captured, which can then be compared against the template or the stored fingerprint pattern. If the two match, then the user's identity is confirmed.

Nowadays, in an electronic device, the under-display fingerprint recognition function is performed by directly affixing (e.g., pasting) the optical fingerprint sensing module to the bottom of the light-emitting panel. However, in the manufacturing process for electronic devices (e.g., attaching the optical fingerprint sensing module to the light-emitting panel) or the maintenance process (e.g., removing the optical fingerprint sensing module from the light-emitting panel), the operation of pasting or removing the optical fingerprint sensing module can easily cause damage to the costly, fragile light-emitting panel, which leads to an increase in production cost and a decrease in yield.

BRIEF SUMMARY OF THE INVENTION

An optical fingerprint sensing module and an electronic device are provided. An embodiment of an optical fingerprint sensing module attached to a base having a first surface, a second surface and an opening extending through the first surface and the second surface is provided. The optical fingerprint sensing module includes a fixing frame and a sensor integrated circuit (IC). The fixing frame is disposed in the opening of the base. The sensor IC is disposed in a receiving groove of the fixing frame and includes a plurality of photo sensors. The photo sensors receive light reflected from a user's finger through the opening of the base.

Furthermore, an embodiment of an electronic device is provided. The electronic device includes a base, an optical fingerprint sensing module, and a panel module. The base includes a first surface, a second surface and an opening extending through the first surface and the second surface. The optical fingerprint sensing module includes a fixing frame and a sensing integrated circuit (IC). The fixing frame is disposed in the opening of the base. The sensing IC is disposed in a receiving groove of the fixing frame, and includes a plurality of photo sensors. The panel module includes a cover glass, and a light-emitting panel disposed under the cover glass and between the cover glass and the optical fingerprint sensing module. The light-emitting panel is configured to provide light to illuminate a user's finger placed on the cover glass. The photo sensors receive light reflected from the user's finger through the opening of the base.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
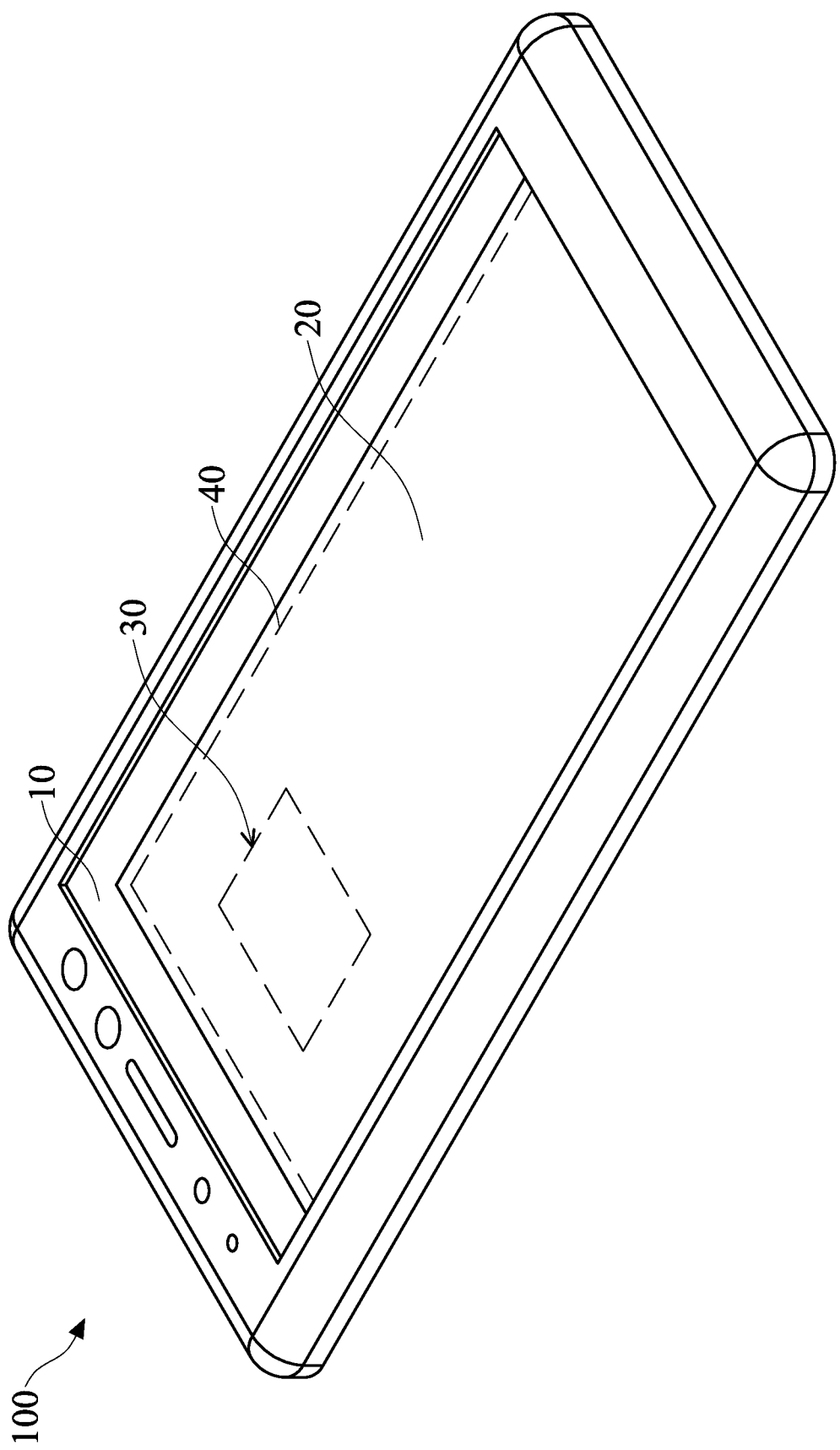
FIG. 1 shows an electronic device according to an embodiment of the invention.

FIG. 1 shows an electronic device 100 according to an embodiment of the invention. The electronic device 100 includes a cover glass 10, a light-emitting panel 20, an optical fingerprint sensing module 30, and a base 40. The cover glass 10 is an insulating surface and disposed on the light-emitting panel 20, so as to cover the light-emitting panel 20. The light-emitting panel 20 includes a light-emitting array (not shown) formed by a plurality of light-emitting devices. In some embodiments, the light-emitting panel 20 is an organic light-emitting diode (OLED) panel, and the light-emitting device is the organic light-emitting diode. In some embodiments, the light-emitting panel 20 is a micro-LED panel, and the light-emitting device is the micro-LED. The optical fingerprint sensing module 30 and the base 40 are disposed under the light-emitting panel 20. The light-emitting panel 20 is configured to provide light to illuminate a user's finger (not shown) placed over the cover glass 10, such that the optical fingerprint sensing module 30 may identify the user's fingerprint. Furthermore, the base 40 is formed by a high hardness material for a support of the light-emitting panel 20. In some embodiments, the base 40 is formed by a conductive material, such as a metal plate. In some embodiments, the electronic device 100 is a mobile phone, and the base 40 is a middle frame for the mobile phone.

Figure 2:
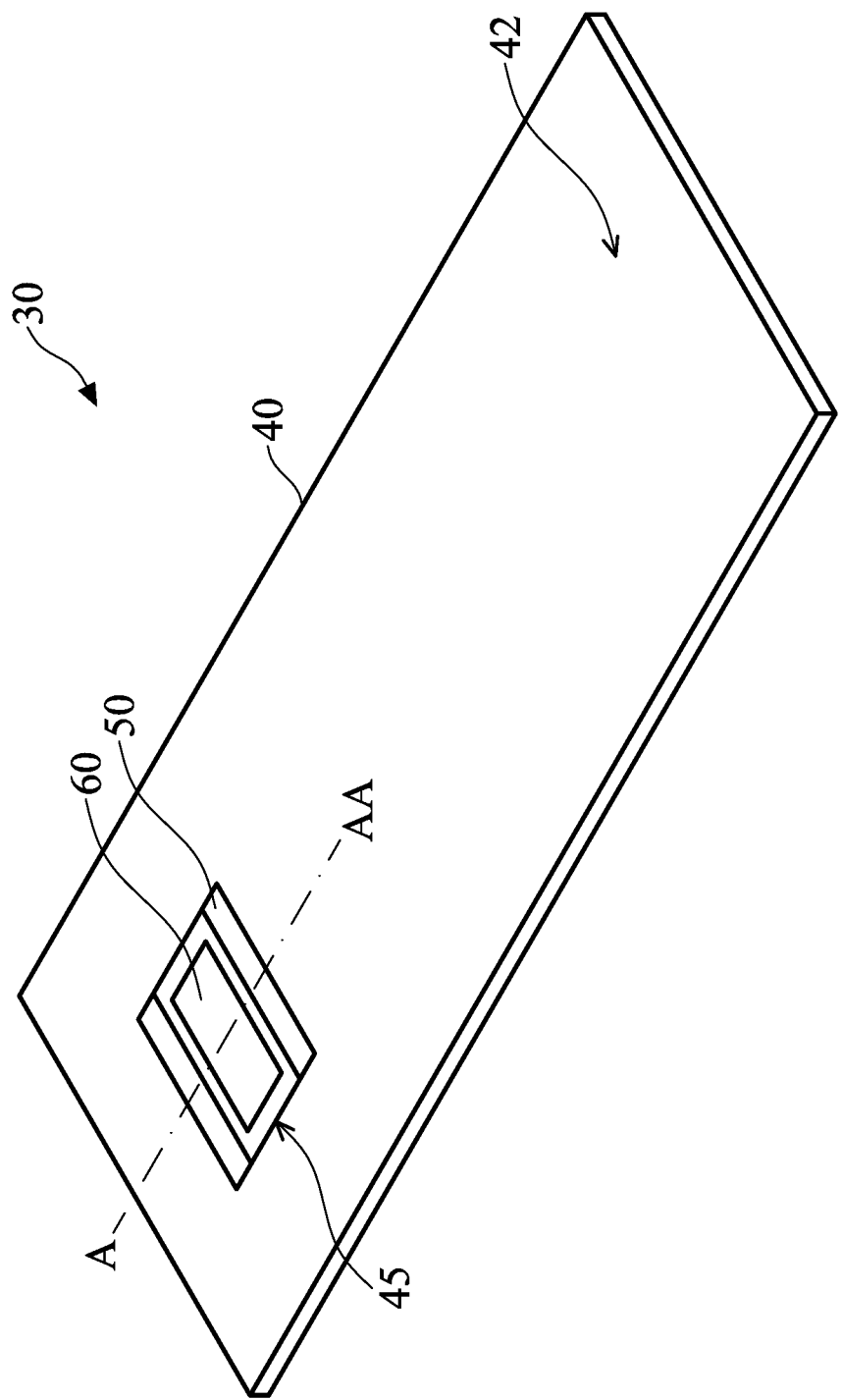
FIG. 2 shows a top view illustrating the optical fingerprint sensing module and the base according to an embodiment of the invention.

FIG. 2 shows a top view illustrating the optical fingerprint sensing module 30 and the base 40 according to an embodiment of the invention. The optical fingerprint sensing module 30 includes a fixing frame (or a holder) 50 and a sensor integrated circuit (IC) 60 (or a chip, a die). The fixing frame 50 is disposed in an opening 45 of the base 40, and the sensor IC 60 is disposed on the fixing frame 50. The sensor IC 60 includes a sensor array (not shown) formed by a plurality of photo sensors. In some embodiments, the photo sensor is a photodiode. An example of the optical fingerprint sensing module 30 will be described later.

Figure 3A:
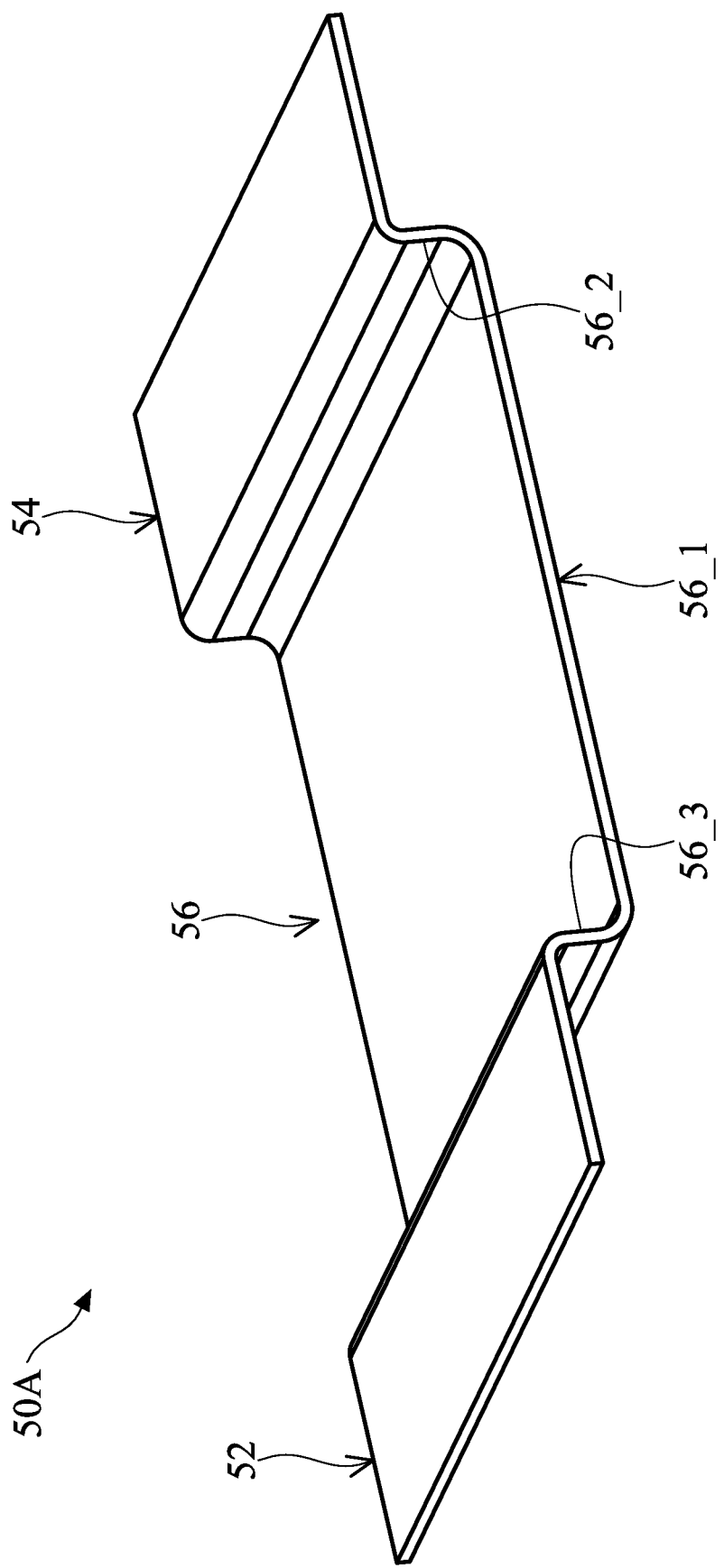
FIG. 3A shows a stereogram view of a fixing frame according to an embodiment of the invention.

FIG. 3A shows a stereogram view of a fixing frame 50A according to an embodiment of the invention. The fixing frame 50A includes a first plate-shaped structure 52, a second plate-shaped structure 54, and a U-shaped structure 56. The U-shaped structure 56 forms a receiving groove. In addition, the first plate-shaped structure 52 and the second plate-shaped structure 54 are connected to the U-shaped structure 56 and respectively disposed on two opposite sides of the U-shaped structure 56. In some embodiments, the U-shaped structure 56 includes the plate-shaped structures 56_1, 56_2, and 56_3. The plate-shaped structure 56_1 forms the bottom of the U-shaped structure 56, and the plate-shaped structures 56_2 and 56_3 respectively form sides of the U-shaped structure 56. In other words, the plate-shaped structure 56_2 is parallel to the plate-shaped structure 56_3 and perpendicular to the plate-shaped structure 56_1. Furthermore, the plate-shaped structure 56_1 is parallel to the first plate-shaped structure 52 and the second plate-shaped structure 54. In some embodiments, the fixing frame 50A is formed by the metal materials. In some embodiments, the fixing frame 50A is an integrally formed structure.

Figure 3B:
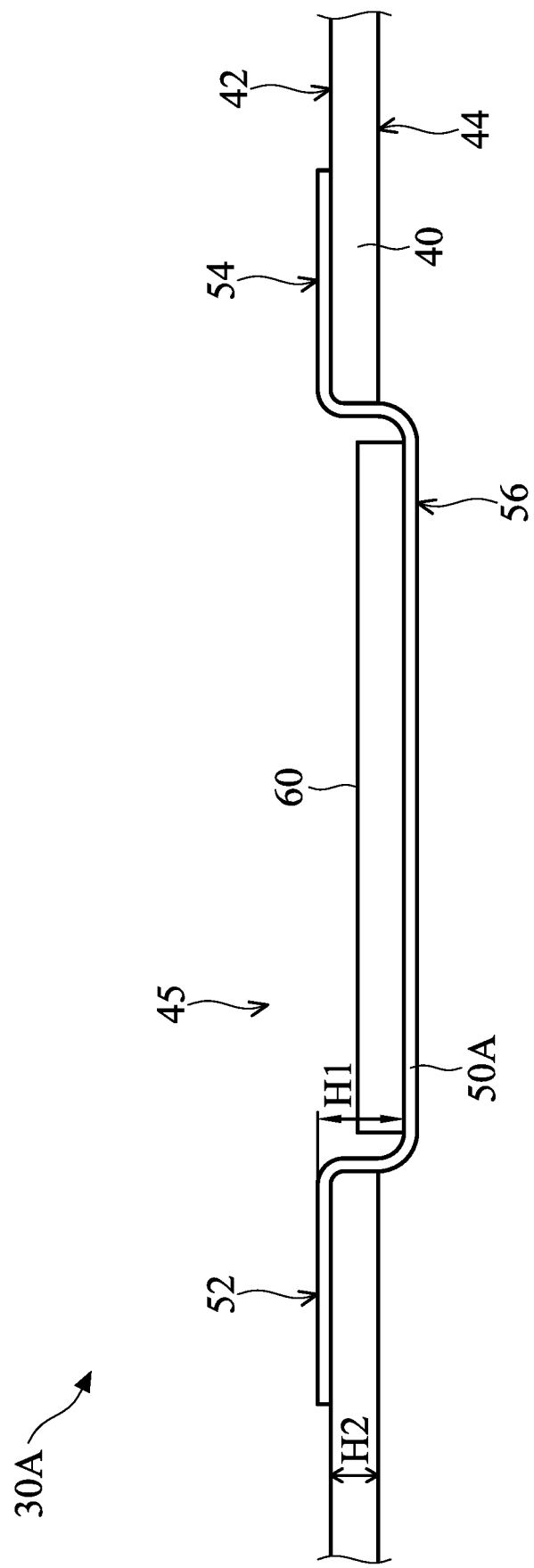
FIG. 3B shows a cross-sectional view along line A-AA of the optical fingerprint sensing module and the base in FIG. 2 according to an embodiment of the invention.

FIG. 3B shows a cross-sectional view along line A-AA of the optical fingerprint sensing module 30A and the base 40 according to an embodiment of the invention. In FIG. 3B, the optical fingerprint sensing module 30A includes the fixing frame 50A of FIG. 3A and the sensor IC 60. The base 40 has a first surface 42 and a second surface 44 that is opposite to the first surface 42. For example, the first surface 42 is the upper surface and the second surface 44 is the lower surface. As shown in FIG. 3B, the base 40 has the opening 45 that extends through the first surface 42 and the second surface 44. The U-shaped structure 56 of the fixing frame 50A is disposed within (or embedded in) the opening 45 of the base 40. Moreover, the first plate-shaped structure 52 and the second plate-shaped structure 54 of the fixing frame 50A are respectively affixed to the first surface 42 of the base 40 through an adhesive (e.g., an adhesive or a double-sided tape), and the first plate-shaped structure 52 and the second plate-shaped structure 54 of the fixing frame 50A are respectively disposed at the opposite sides of the opening 45 of the base 40. For example, the first plate-shaped structure 52 of the fixing frame 50A is disposed on the left side of the opening 45 of the base 40, and the second plate-shaped structure 54 of the fixing frame 50A is disposed on the right side of the opening 45 of the base 40. The depth H1 of the U-shaped structure 56 is greater than the thickness H2 of the base 40, i.e., H1>H2. The sensor IC 60 is disposed on the bottom of the U-shaped structure 56 of the fixing frame 50A (i.e., the plate-shaped structure 56_1 of FIG. 3A). As described above, the light-emitting panel 20 is disposed over the base 40 (i.e., close to the first surface 42 of the base 40), and the cover glass 10 is disposed over the light-emitting panel 20. When the user places a finger over the cover glass 10, the photo sensors (not shown) of the sensor IC 60 may receive reflected light from the user's finger through the opening 45 of the base 40. The fingerprint ridge and the fingerprint valley of the finger will produce different reflected light, such as different light energy or light wavelength. Thus, after receiving the reflected light, the photo sensors may convert the received reflected light into a sensing output, and may provide the sensing output to a processor (not shown) of the electronic device 100 or other subsequent circuits, so as to obtain fingerprint information of the finger.

Figure 4A:
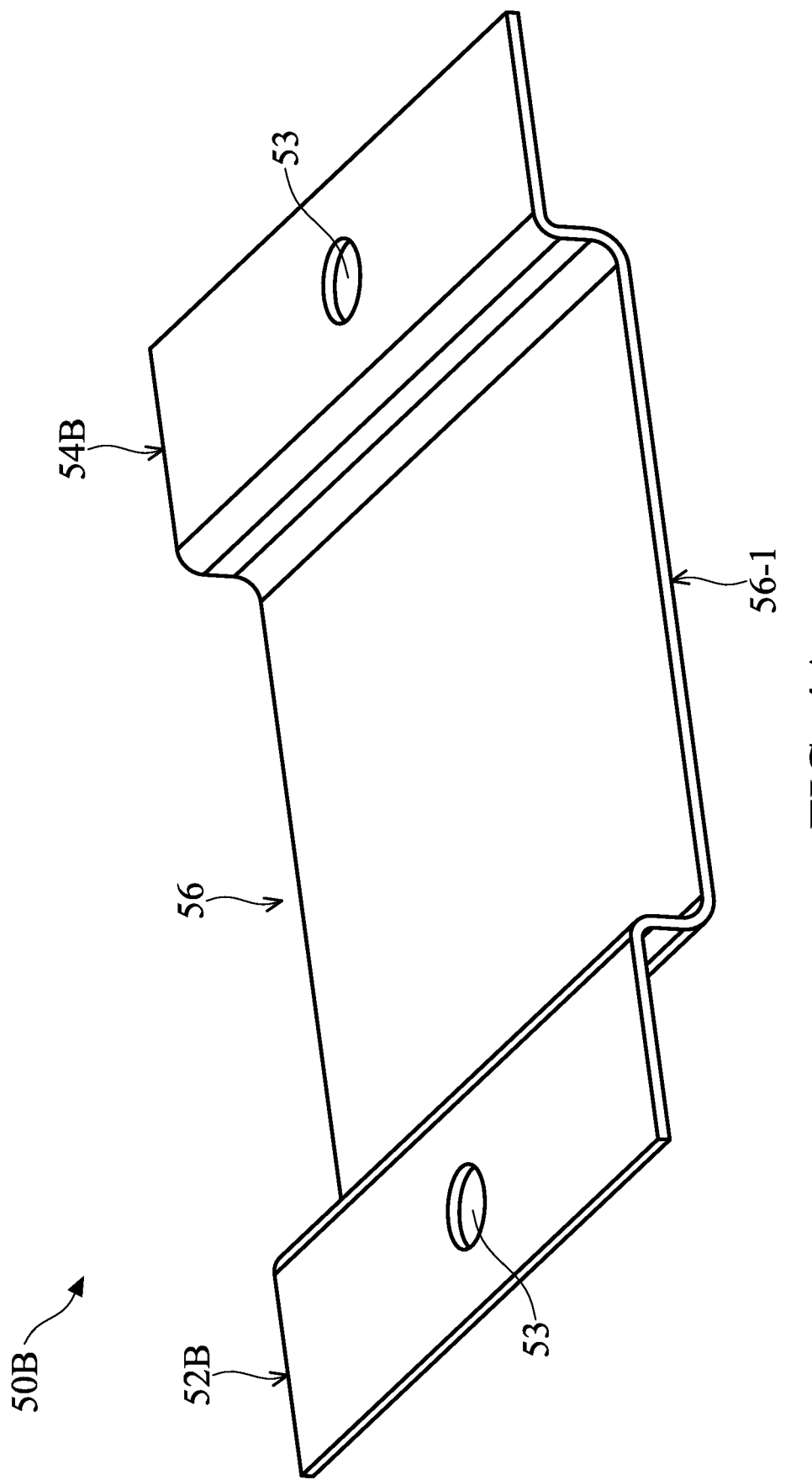
FIG. 4A shows a stereogram view of a fixing frame according to an embodiment of the invention.

FIG. 4A shows a stereogram view of a fixing frame 50B according to an embodiment of the invention. The fixing frame 50B includes a first plate-shaped structure 52B, a second plate-shaped structure 54B, and a U-shaped structure 56. Compared with the fixing frame 50A of FIG. 3A, the first plate-shaped structure 52B and the second plate-shaped structure 54B of the fixing frame 50B have the holes 53, respectively. In some embodiments, the fixing frame 50B is fixed in the base 40B (shown in FIG. 4B) having the corresponding holes by inserting a screw or a positioning column within the hole 53. It should be noted that the number of holes 53 of the first plate-shaped structure 52B and the second plate-shaped structure 54B is determined according to actual application. In some embodiments, the fixing frame 50B is formed by the metal materials. In some embodiments, the fixing frame 50B is an integrally formed structure.

Figure 4B:
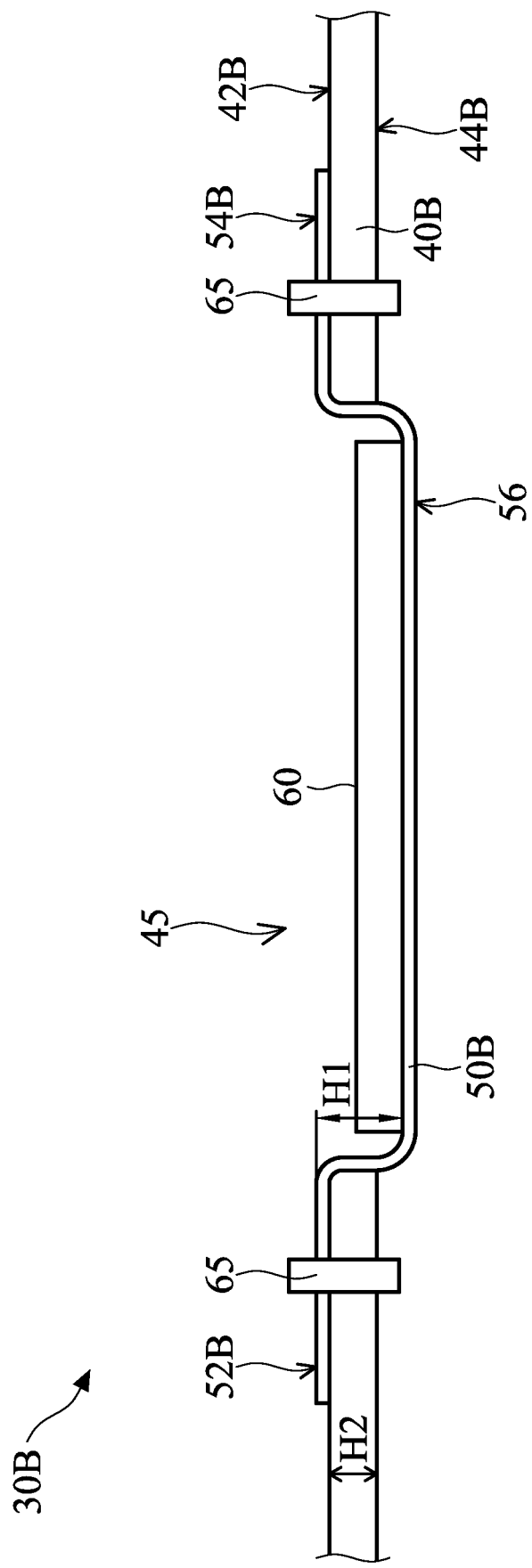
FIG. 4B shows a cross-sectional view along line A-AA of the optical fingerprint sensing module in FIG. 2 according to an embodiment of the invention.

FIG. 4B shows a cross-sectional view along line A-AA of the optical fingerprint sensing module 30B and the base 40B in FIG. 2 according to an embodiment of the invention. In FIG. 4B, the optical fingerprint sensing module 30B includes the fixing frame 50B of FIG. 4A and the sensor IC 60. The base 40B has a first surface 42B and a second surface 44B opposite to the first surface 42B, and the base 40B has the opening 45 extending through the first surface 42B and the second surface 44B. The U-shaped structure 56 of the fixing frame 50B is disposed within (or embedded in) the opening 45 of the base 40B. Further, by fixing the positioning post 65 (or the screw) into the holes 53 of the first plate-shaped structure 52B and the second plate-shaped structure 54B of the fixing frame 50B, the first plate-shaped structure 52B and the second plate-shaped structure 54B of the fixing frame 50B are placed on the first surface 42B of the base 40B. As described above, the first plate-shaped structure 52B and the second plate-shaped structure 54B of the fixing frame 50B are disposed on the left and right sides of the opening 45 of the base 40B, respectively. The depth H1 of the U-shaped structure 56 is greater than the thickness H2 of the base 40, i.e., H1>H2. The sensor IC 60 is disposed on the bottom of the U-shaped structure 56 of the fixing frame 50B (i.e., the plate-shaped structure 56_1 of FIG. 4A). As described above, the light-emitting panel 20 is disposed over the base 40B (i.e., close to the first surface 42B of the base 40B), and the cover glass 10 is disposed over the light-emitting panel 20. When the user places a finger over the cover glass 10, the photo sensors (not shown) of the sensor IC 60 are configured to receive reflected light from the user's finger through the opening 45 of the base 40B. The fingerprint ridge and the fingerprint valley of the finger will produce different reflected light, such as different light energy or light wavelength. Thus, after receiving the reflected light, the photo sensors may convert the received reflected light into a sensing output, and may provide the sensing output to a processor (not shown) of the electronic device 100 or other subsequent circuits, so as to obtain fingerprint information of the finger.

Figure 5A:
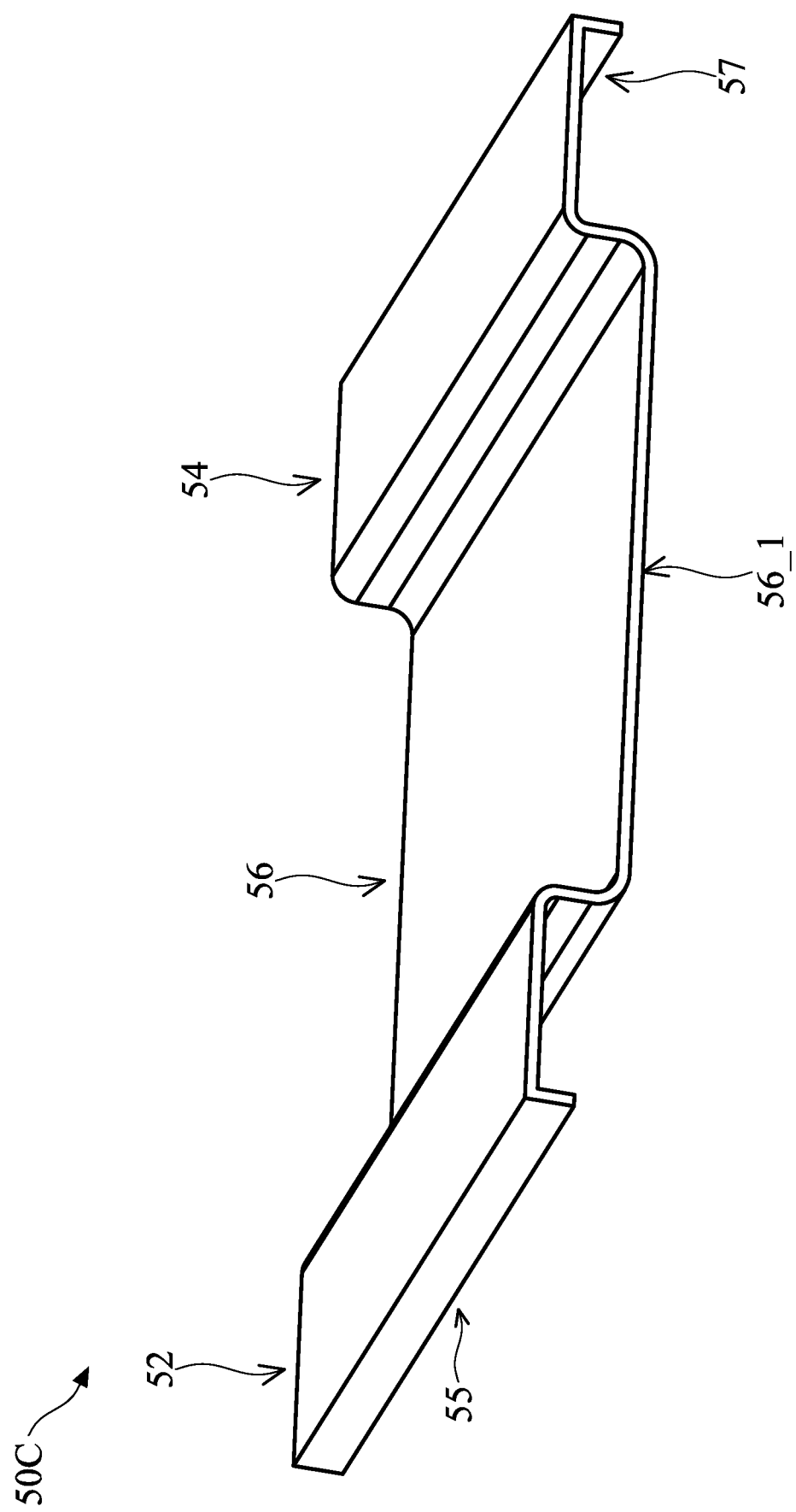
FIG. 5A shows a stereogram view of a fixing frame according to an embodiment of the invention.

FIG. 5A shows a stereogram view of a fixing frame 50C according to an embodiment of the invention. The fixing frame 50C includes a first plate-shaped structure 52, a second plate-shaped structure 54, and a U-shaped structure 56. The U-shaped structure 56 forms a receiving groove. In addition, the first plate-shaped structure 52 and the second plate-shaped structure 54 are respectively disposed on two opposite sides of the U-shaped structure 56. Compared with the fixing frame 50A of FIG. 3A, the fixing frame 50C further includes a third plate-shaped structure 55 and a fourth plate-shaped structure 57. The third plate-shaped structure 55 is connected to the first plate-shaped structure 52 and is perpendicular to the first plate-shaped structure 52. Furthermore, the fourth plate-shaped structure 57 is connected to the second plate-shaped structure 54 and is perpendicular to the second plate-shaped structure 54. In other words, the third plate-shaped structure 55 is parallel to the fourth plate-shaped structure 57. In some embodiments, the fixing frame 50C is formed by the metal materials. In some embodiments, the fixing frame 50C is an integrally formed structure.

Figure 5B:
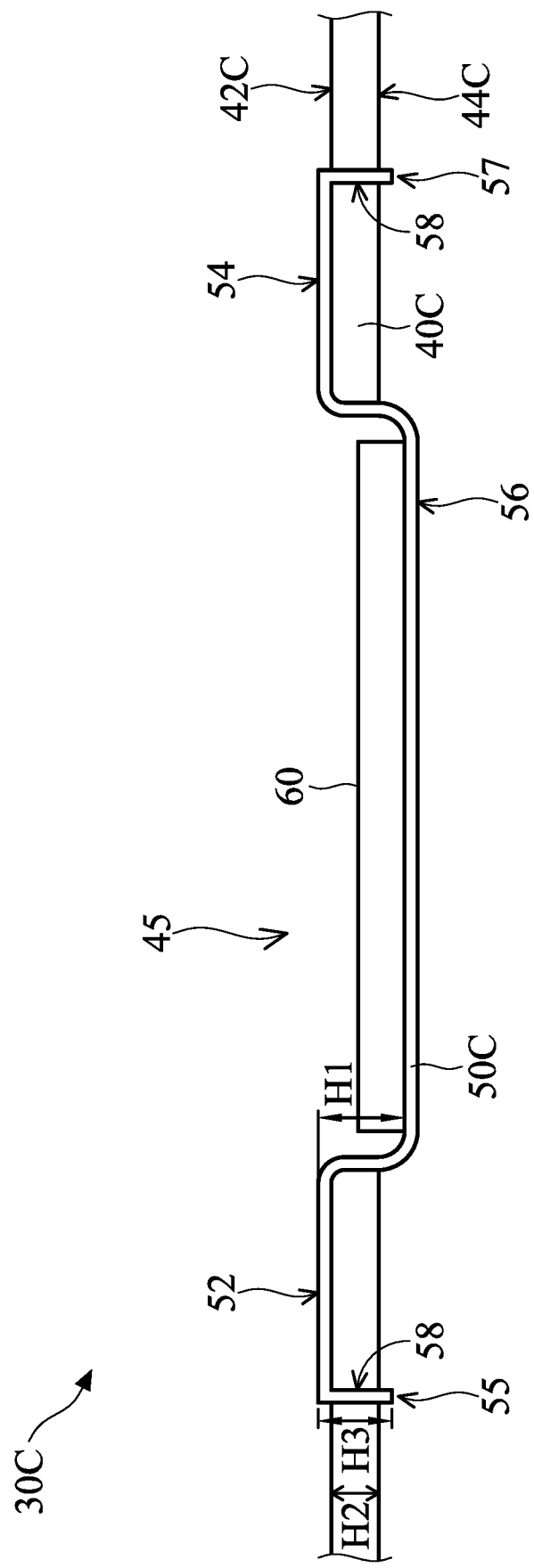
FIG. 5B shows a cross-sectional view along line A-AA of the optical fingerprint sensing module in FIG. 2 according to an embodiment of the invention.

FIG. 5B shows a cross-sectional view along line A-AA of the optical fingerprint sensing module 30C and the base 40C in FIG. 2 according to an embodiment of the invention. In FIG. 5B, the optical fingerprint sensing module 30C includes the fixing frame 50C of FIG. 5A and the sensor IC 60. The base 40C has a first surface 42C and a second surface 44C opposite to the first surface 42C, and the base 40C has the opening 45 extending through the first surface 42C and the second surface 44C. Moreover, the base 40C further has two slots 58 on opposite sides of the opening 45, respectively. The U-shaped structure 56 of the fixing frame 50C is disposed within (or embedded in) the opening 45 of the base 40C. In addition, by inserting the third plate-shaped structure 55 and the fourth plate-shaped structure 57 of the fixing frame 50C into the corresponding slots 58 of the base 40C, the first plate-shaped structure 52 and the second plate-shaped structure 54 of the fixing frame 50C are placed on the first surface 42C of the base 40C. The depth H1 of the U-shaped structure 56 is greater than the thickness H2 of the base 40, i.e., H1>H2. Furthermore, the height H3 of the third plate-shaped structure 55 and the fourth plate-shaped structure 57 is smaller than the depth H1 of the U-shaped structure 56, i.e., H1>H3. In some embodiments, the height H3 of the third plate-shaped structure 55 and the fourth plate-shaped structure 57 is greater than the thickness H2 of the base 40, i.e., H3>H2. In other embodiments, the height H3 of the third plate-shaped structure 55 and the fourth plate-shaped structure 57 is less than the thickness H2 of the base 40C, i.e., H3<H2. The sensor IC 60 is disposed on the bottom of the U-shaped structure 56 of the fixing frame 50C (i.e., the plate-shaped structure 56_1 of FIG. 5A). As described above, the light-emitting panel 20 is disposed over the base 40C (i.e., close to the first surface 42 of the base 40C), and the cover glass 10 is disposed over the light-emitting panel 20. When the user places a finger over the cover glass 10, the photo sensors (not shown) of the sensor IC 60 are configured to receive reflected light from the user's finger through the opening 45 of the base 40C. The fingerprint ridge and the fingerprint valley of the finger will produce different reflected light, such as different light energy or light wavelength. Thus, after receiving the reflected light, the photo sensors may convert the received reflected light into a sensing output, and may provide the sensing output to a processor (not shown) of the electronic device 100 or other subsequent circuits, so as to obtain fingerprint information of the finger.

Figure 6:
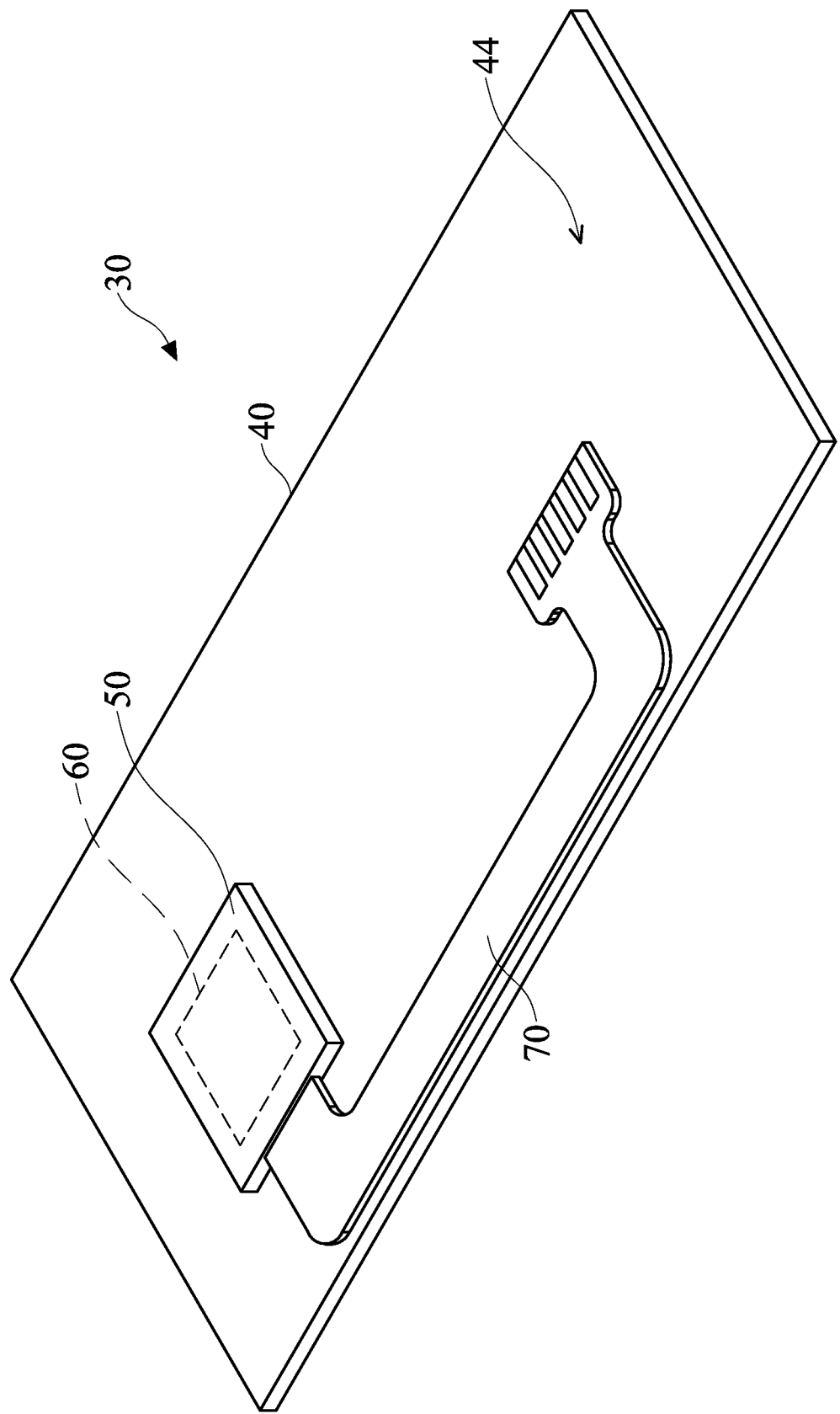
FIG. 6 shows a bottom view of the optical fingerprint sensing module according to an embodiment of the invention.

FIG. 6 shows a bottom view of the optical fingerprint sensing module 30 according to an embodiment of the invention. As described above, the depth of the receiving groove of the U-shaped structure 56 of the fixing frame 50 is greater than the thickness of the base 40. Therefore, in FIG. 6, the receiving groove of the fixing frame 50 is higher than (protruding than) the base 40. In addition, the sensor IC 60 within the fixing frame 50 is electrically connected to a flexible printed circuit board (FPC) 70, so as to provide the sensing output of the photo sensors to the processor of the electronic device 100 (not shown) or other circuits through the flexible printed circuit board 70. Moreover, the flexible printed circuit board 70 is disposed on the second surface 44 of the base 40. In some embodiments, the sensor IC 60 is electrically connected to the flexible printed circuit board 70 by soldering manner. In some embodiments, the fixing frame 50 and the base 40 are formed by the same material. In some embodiments, the fixing frame 50 and the base 40 are integrated to form an integrally formed substrate. For example, the integrally formed substrate includes the base 40 and the U-shaped structure 56 of the fixing frame 50.

When forming the optical fingerprint sensing module 30, the U-shaped structure 56 of the fixing frame 50 may be first placed in the opening 45 of the base 40. Next, the sensor IC 60 electrically connected to the flexible printed circuit board 70 is placed into the U-shaped structure 56 of the fixing frame 50 through a gap between the U-shaped structure 56 of the fixing frame 50 and the base 40, and the sensor IC 60 is fixed at the bottom of the U-shaped structure 56. Next, a packaging process is performed on the sensor IC 60 within the U-shaped structure 56 of the fixing frame 50.

Figure 7:
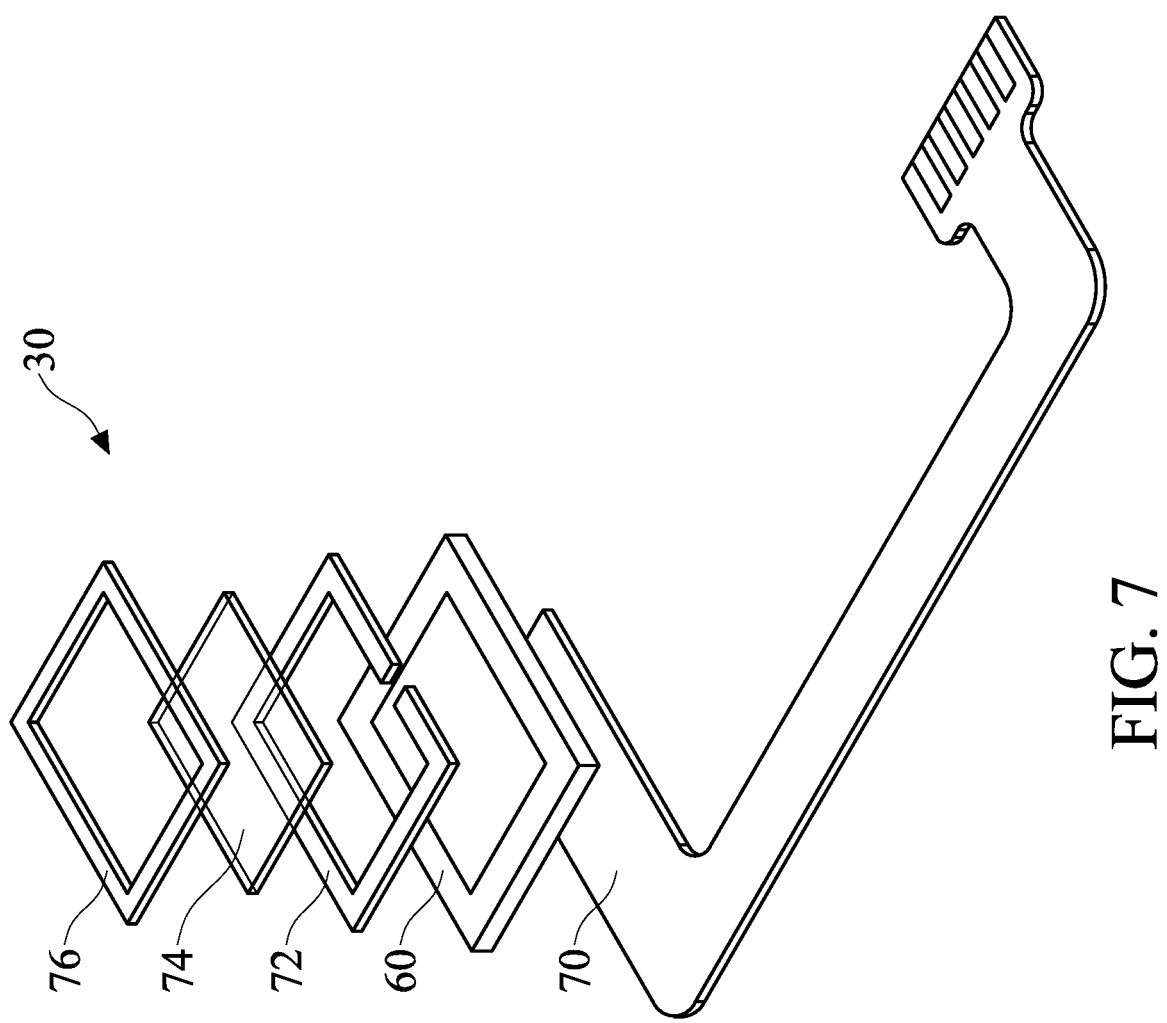
FIG. 7 is a diagram illustrating the execution of a packaging process for the sensor IC according to an embodiment of the invention.

FIG. 7 is a diagram illustrating the execution of a packaging process for the sensor IC 60 according to an embodiment of the invention. First, a molding process is performed on the U-shaped structure 56 of the fixing frame 50 (i.e., the receiving groove), so as to surround the sensor IC 60 with the Die Attach Film (DAF), the Die Attach Paste (DAP) or the molding compound 72, such as an epoxy molding compound (EMC). In addition, the molding compound 72 forms an opening, so that the sensor array of the sensor IC 60 exposes to the molding material 72. Next, a UV-IR cut filter 74 is disposed on the molding compound 72 such that the reflected light passes through the UV-IR cut filter 74 before reaching the sensor array of the sensor IC 60. Next, a black tape 76 is disposed on the UV-IR cut filter 74.

In the embodiments of the invention, the sensor IC 60 is affixed to the base 40 through the fixing frame 50. Additionally, the sensor IC 60 is disposed on the bottom of a receiving groove of the U-shaped structure 56 of the fixing frame 50. Compared with the conventional mounting method for directly fixing (e.g., adhering) the sensor IC to the light-emitting panel, and the sensor IC 60 of the embodiments of the invention is affixed to the middle frame (i.e., the base 40) of the mobile phone through the fixing frame 50, which is placed under the light-emitting panel 20. Therefore, when the optical fingerprint sensing module 30 is disposed under the light-emitting panel 20, the optical fingerprint sensing module 30 can be prevented from directly adhering to the light-emitting panel 20 to cause damage to the light-emitting panel 20. Similarly, when the optical fingerprint sensing module 30 needs to be replaced, it can avoid damaging the light-emitting panel 20. Therefore, the production yield of the electronic device 100 is improved, thereby reducing the production cost and reducing the debugging time.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical fingerprint sensing module attached to a base, wherein the base comprises a first surface, a second surface and an opening extending through the first surface and the second surface, the optical fingerprint sensing module comprising:
   a fixing frame disposed in the opening of the base; and
   a sensor integrated circuit (IC) disposed in a receiving groove of the fixing frame, comprising a plurality of photo sensors,
   wherein the photo sensors receive light reflected from a user's finger through the opening of the base;
   wherein the first surface and the second surface are an upper surface and a lower surface of the base, respectively.

2. The optical fingerprint sensing module as claimed in claim 1, wherein the receiving groove of the fixing frame is a U-shaped structure, and the receiving groove is disposed in the opening of the base.

3. The optical fingerprint sensing module as claimed in claim 1, wherein a depth of the receiving groove of the fixing frame is greater than a thickness of the base.

4. The optical fingerprint sensing module as claimed in claim 1, wherein a first plate-shaped structure and a second plate-shaped structure of the fixing frame are disposed on the first surface of the base and disposed on two opposite sides of the opening of the base.

5. The optical fingerprint sensing module as claimed in claim 4, wherein the first plate-shaped structure and the second plate-shaped structure of the fixing frame are respectively affixed to the first surface of the base through an adhesive.

6. The optical fingerprint sensing module as claimed in claim 4, wherein the first plate-shaped structure and the second plate-shaped structure of the fixing frame are respectively affixed to the first surface of the base via a screw or a positioning column.

7. The optical fingerprint sensing module as claimed in claim 4, wherein the first plate-shaped structure and the second plate-shaped structure of the fixing frame are respectively affixed to the first surface of the base through a third plate-shaped structure and a fourth plate-shaped structure of the fixing frame, wherein the first plate-shaped structure is connected and perpendicular to the third plate-shaped structure, and the second plate-shaped structure is connected and perpendicular to the fourth plate-shaped structure.

8. The optical fingerprint sensing module as claimed in claim 1, further comprising:
   a flexible printed circuit board electrically connected to the sensor IC and disposed on the second surface of the base.

9. An electronic device, comprising:
   a base comprising a first surface, a second surface and an opening extending through the first surface and the second surface;
   an optical fingerprint sensing module, comprising:
      a fixing frame disposed in the opening of the base; and
      a sensing integrated circuit (IC) disposed in a receiving groove of the fixing frame, comprising a plurality of photo sensors; and
   a panel module, comprising:
      a cover glass; and
      a light-emitting panel disposed under the cover glass and between the cover glass and the optical fingerprint sensing module, providing light to illuminate a user's finger placed on the cover glass,
   wherein the photo sensors receive light reflected from the user's finger through the opening of the base;
   wherein the first surface and the second surface are an upper surface and a lower surface of the base, respectively.

10. The electronic device as claimed in claim 9, wherein the light-emitting panel comprises a plurality of organic light-emitting diodes.

11. The electronic device as claimed in claim 9, wherein the receiving groove of the fixing frame is a U-shaped structure, and the receiving groove is disposed in the opening of the base.

12. The electronic device as claimed in claim 9, wherein depth of the receiving groove of the fixing frame is greater than thickness of the base.

13. The electronic device as claimed in claim 9, wherein in the optical fingerprint sensing module, a first plate-shaped structure and a second plate-shaped structure of the fixing frame are disposed on the first surface of the base, and the first plate-shaped structure and the second plate-shaped structure of the fixing frame are disposed on two opposite sides of the opening of the base.

14. The electronic device as claimed in claim 13, wherein the first plate-shaped structure and the second plate-shaped structure of the fixing frame are respectively affixed to the first surface of the base through an adhesive.

15. The electronic device as claimed in claim 13, wherein the first plate-shaped structure and the second plate-shaped structure of the fixing frame are respectively affixed to the first surface of the base via a screw or a positioning column.

16. The electronic device as claimed in claim 13, wherein the first plate-shaped structure and the second plate-shaped structure of the fixing frame are respectively affixed to the first surface of the base through a third plate-shaped structure and a fourth plate-shaped structure of the fixing frame, wherein the first plate-shaped structure is connected and perpendicular to the third plate-shaped structure, and the second plate-shaped structure is connected and perpendicular to the fourth plate-shaped structure.

17. The electronic device as claimed in claim 13, further comprising:

a flexible printed circuit board electrically connected to the sensor IC and disposed on the second surface of the base.

\* \* \* \* \*